United States Patent
Ko et al.

(10) Patent No.: US 11,152,511 B2
(45) Date of Patent: Oct. 19, 2021

(54) THIN-FILM TRANSISTOR AND DISPLAY PANEL

(71) Applicant: LG Display Co., Ltd., Seoul (KR)

(72) Inventors: SunWook Ko, Paju-si (KR); KumMi Oh, Seoul (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/706,640

(22) Filed: Dec. 6, 2019

(65) Prior Publication Data
US 2020/0194594 A1    Jun. 18, 2020

(30) Foreign Application Priority Data
Dec. 18, 2018  (KR) .................. 10-2018-0163871

(51) Int. Cl.
| | |
|---|---|
| *H01L 29/786* | (2006.01) |
| *H01L 27/12* | (2006.01) |
| *H01L 29/10* | (2006.01) |
| *H01L 29/423* | (2006.01) |
| *H01L 29/78* | (2006.01) |

(52) U.S. Cl.
CPC .... *H01L 29/78648* (2013.01); *H01L 27/1214* (2013.01); *H01L 29/1033* (2013.01); *H01L 29/42356* (2013.01); *H01L 29/7833* (2013.01)

(58) Field of Classification Search
CPC ........... H01L 29/78648; H01L 27/1214; H01L 29/1033; H01L 29/42356; H01L 29/7833; H01L 29/78696; H01L 29/78645; H01L 27/124; H01L 27/1248; G09G 2300/0417; G09G 2320/0233; G09G 2300/0861; G09G 2300/0842; G09G 2300/0819; G09G 3/3233
See application file for complete search history.

(56) References Cited

U.S. PATENT DOCUMENTS

| | | | |
|---|---|---|---|
| 2008/0128705 A1 | 6/2008 | Ishiguro | |
| 2012/0146043 A1* | 6/2012 | Kitakado | .......... H01L 29/78648 257/72 |
| 2017/0053951 A1 | 2/2017 | Sato | |
| 2017/0148817 A1 | 5/2017 | Shi et al. | |
| 2018/0269332 A1* | 9/2018 | Hu | ...................... H01L 27/1214 |

* cited by examiner

*Primary Examiner* — Mohammed R Alam
(74) *Attorney, Agent, or Firm* — Fenwick & West LLP

(57) ABSTRACT

A thin-film transistor and a display panel are provided in which current characteristics of the thin-film transistor are improved by a dual gate electrode structure, and the output characteristics of the thin-film transistor are improved by dividing the top gate electrode (or bottom gate electrode) of the dual gate electrode into two electrodes and applying a back bias voltage to the top gate electrode adjacent to a source region. A high-resolution display panel or a transparent display panel is realized by increasing the aperture ratio (or transmittance) of the display panel using the highly integrated high-current device.

14 Claims, 11 Drawing Sheets

THIN-FILM TRANSISTOR AND DISPLAY PANEL

CROSS REFERENCE TO RELATED APPLICATION

This application claims priority to Korean Patent Application No. 10-2018-0163871, filed on Dec. 18, 2018, which is hereby incorporated by reference for all purposes as if fully set forth herein.

BACKGROUND

Field

Exemplary embodiments relate to a thin-film transistor and a display panel.

Description of Related Art

In response to the development of the information society, demand for a variety of types of display devices for displaying images is increasing. In this regard, a range of display devices, such as liquid crystal display (LCD) devices, and organic light-emitting diode (OLED) display devices, have come into widespread use.

Such a display device includes, for example, a display panel in which a plurality of subpixels are disposed in the form of a matrix. The display device can display images by controlling luminous levels represented by the plurality of subpixels. In addition, a light-emitting element and a circuit element driving the light-emitting element may be disposed in each of the subpixels.

In existing display panels, there may be a problem that it is difficult to increase the aperture ratio of a subpixel using a circuit element disposed in the subpixel, and thus, there may be great difficulty in realizing a high-resolution display device.

BRIEF SUMMARY

An object of exemplary embodiments is to increase current characteristics while reducing the size of a thin-film transistor disposed in a subpixel of a display panel.

Another object of exemplary embodiments is to stabilize output characteristics of a thin-film transistor while improving a current characteristic of the thin-film transistor.

Another object of exemplary embodiments is to increase the aperture ratio (or transmittance) of a display panel by a thin-film transistor having high current characteristics and improved reliability.

According to an aspect, exemplary embodiments may provide a thin-film transistor including: an active layer comprising a source region, a drain region, and a first channel region and a second channel region disposed between the source region and the drain region and separated from each other by a conducting region; a first gate electrode disposed on a first side of the active layer; a second gate electrode disposed on a second side of the active layer, opposite to the first side, so as to correspond to the first channel region; and a third gate electrode disposed on the second side of the active layer so as to correspond to the second channel region. In this thin-film transistor, a gate voltage may be applied to the first gate electrode and the third gate electrode, and a back bias voltage may be applied to the second gate electrode.

According to another aspect, exemplary embodiments may provide a display panel including: a first gate electrode; a first gate insulating layer disposed on the first gate electrode; an active layer having a source region, a drain region, and a first channel region and a second channel region disposed between the source region and the drain region and separated from each other by a conducting region; a second gate insulating layer disposed on the active layer; a second gate electrode disposed on the second gate insulating layer so as to correspond to the first channel region; and a third gate electrode disposed on the second gate insulating layer so as to correspond to the second channel region.

According to another aspect, exemplary embodiments may provide a display panel including: a plurality of subpixels; a plurality of light-emitting elements disposed in each of the plurality of subpixels; and a plurality of driving transistors disposed in each of the plurality of subpixels to drive the light-emitting elements. In the display panel, each of the plurality of driving transistors includes an active layer having a source region, a drain region, and a first channel region and a second channel region disposed between the source region and the drain region and separated from each other by a conducting region; a first gate electrode disposed on a first side of the active layer so as to correspond to at least a portion of the first channel region and at least a portion of the second channel region; a second gate electrode disposed on a second side of the active layer, opposite to the first side, so as to correspond to the first channel region; and a third gate electrode disposed on the second side of the active layer so as to correspond to the second channel region.

According to exemplary embodiments, the current characteristics of the thin-film transistor can be improved by the dual gate electrode structure disposed above/below the thin-film transistor.

According to exemplary embodiments, the output characteristics of the thin-film transistor can be improved by separating the top gate electrode (or bottom gate electrode) of the dual gate electrode into two electrodes and applying a back bias voltage to the top gate electrode adjacent to the source region.

According to exemplary embodiments, the reliability of a high-resolution display device can be improved by increasing the aperture ratio (or transmittance) of the display panel using the highly integrated high-current device.

DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
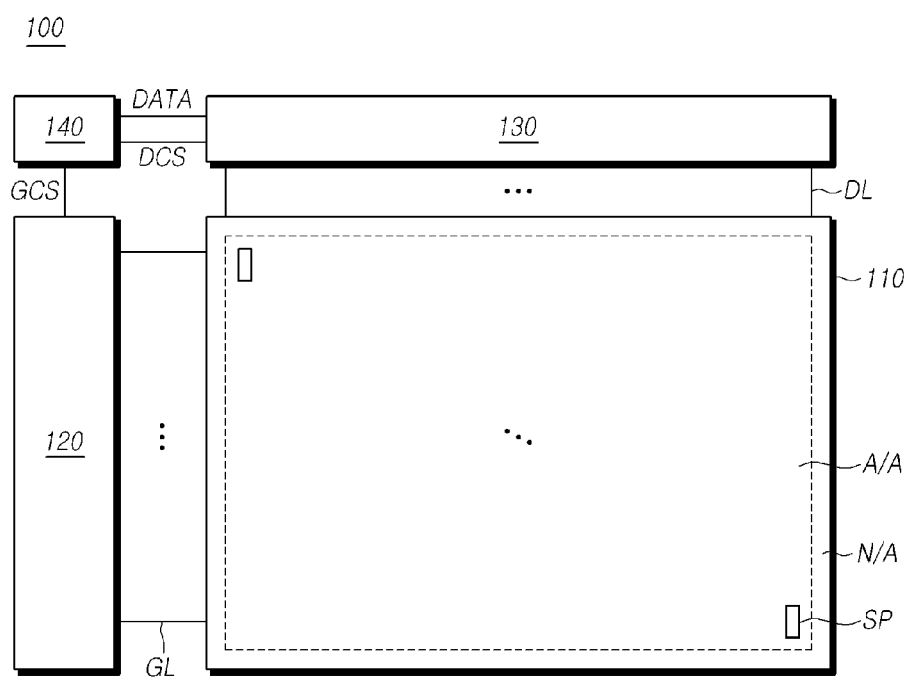
FIG. 1 illustrates a schematic configuration of a display device according to exemplary embodiments.

Hereinafter, reference will be made to exemplary embodiments in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated into the present disclosure will be omitted in the case that the subject matter of the present disclosure may be rendered unclear thereby.

It will also be understood that, while terms, such as "first," "second," "A," "B," "(a)," and "(b)," may be used herein to describe various elements, such terms are merely used to distinguish one element from other elements. The substance, sequence, order, or number of such elements is not limited by these terms. It will be understood that when an element is referred to as being "connected," "coupled," or "linked" to another element, not only can it be "directly connected, coupled, or linked" to the other element, but it can also be "indirectly connected, coupled, or linked" to the other element via an "intervening" element.

FIG. 1 illustrates a schematic configuration of a display device 100 according to exemplary embodiments.

Referring to FIG. 1, the display device 100 according to exemplary embodiments may include a display panel 110 including an active area A/A and a non-active area N/A, as well as components for driving the display panel 110, such as a gate driver circuit 120, a data driver circuit 130, and a controller 140.

In the display panel 110, a plurality of gate lines GL and a plurality of data lines DL are disposed, and a plurality of subpixels SP are disposed in areas in which the plurality of gate lines GL intersect the plurality of data lines DL. Each of the plurality of subpixels SP may include circuit elements, and two or more subpixels SP may provide a single pixel.

The gate driver circuit 120 is controlled by the controller 140 to sequentially output a scanning signal to the plurality of gate lines GL, disposed in the display panel 110, thereby controlling points in time at which the plurality of subpixels SP are driven. In addition, the gate driver circuit 120 may output an emission signal to control emission times of the subpixels SP. The circuit outputting the scanning signal and the circuit outputting the emission signal may be provided integrally or separately.

The gate driver circuit 120 may include one or more gate driver integrated circuits (ICs). The gate driver circuit 120 may be disposed on one side or both sides of the display panel 110, depending on the driving system.

Each of the gate driver ICs may be connected to a bonding pad of the display panel 110 by a tape-automated bonding (TAB) method or a chip-on-glass (COG) method, may be implemented using a gate-in-panel (GIP) structure directly disposed in the display panel 110, or in some cases, may be integrated with the display panel 110. Alternatively, each of the gate driver ICs may be implemented using a chip-on-film (COF) structure mounted on a film connected to the display panel 110.

The data driver circuit 130 receives image data from the controller 140 and converts the image data into an analog data voltage. In addition, the data driver circuit 130 outputs the data voltage to the data lines DL, respectively, at points in time at which the scanning signal is applied through the gate lines GL, so that the subpixels SP represent luminous intensities corresponding to the image data.

The data driver circuit 130 may include one or more source driver ICs, and each of the source driver ICs may include a shift register, a latch circuit, a digital-to-analog converter (DAC), an output buffer, and the like.

Each of the source driver ICs may be connected to a bonding pad of the display panel 110 by a tape-automated bonding (TAB) method or by a chip-on-glass (COG) method, may directly mounted on the display panel 110, or in some cases, may be integrated with the display panel 110. In addition, each of the source driver ICs may be implemented using a chip-on-film (COF) structure mounted on a film connected to the display panel 110. In this case, each of the source driver ICs may be mounted on a film connected to the display panel 110, and may be electrically connected to the display panel 110 through lines on the film.

The controller 140 supplies a variety of control signals to the gate driver circuit 120 and the data driver circuit 130 to control the operations of the gate driver circuit 120 and the data driver circuit 130.

The controller 140 controls the gate driver circuit 120 to output the scanning signal at points in time defined by frames. The controller 140 converts image data, received from an external source, into a data signal format readable by the data driver circuit 130, and outputs the converted image data to the data driver circuit 130.

The controller 140 receives a variety of timing signals, including a vertical synchronization signal Vsync, a horizontal synchronization signal Hsync, an input data enable (DE) signal, a clock (CLK) signal, and the like, in addition to the image data, from an external source (e.g. a host system).

The controller 140 may generate a variety of control signals using the variety of timing signals received from the external source and output the control signals to the gate driver circuit 120 and the data driver circuit 130.

For example, the controller 140 outputs a variety of gate control signals GCS, including a gate start pulse (GSP) signal, a gate shift clock (GSC) signal, a gate output enable (GOE) signal, and the like, to control the gate driver circuit 120.

Here, the gate start pulse controls the operation start time of the one or more gate driver ICs of the gate driver circuit 120. The gate shift clock is a clock signal commonly input to the one or more gate driver ICs to control the shift time of the scanning signal. The gate output enable signal designates timing information of the one or more gate driver ICs.

In addition, the controller 140 outputs a variety of data control signals DCS, including a source start pulse (SSP) signal, a source sampling clock (SSC) signal, a source output enable (SOE) signal, and the like, to control the data driver circuit 130.

The source start pulse controls the data sampling start time of the one or more source driver ICs of the data driver circuit 130. The source sampling clock is a clock signal controlling the sampling time of data in each of the source driver ICs. The source output enable signal controls the output time of the data driver circuit 130.

The display device 100 may further include a power management integrated circuit (PMIC) to supply various forms of voltage or current to the display panel 110, the gate driver circuit 120, the data driver circuit 130, and the like, or control various forms of voltage or current to be supplied to the same.

In addition, signal or voltage lines, through which a variety of signals or voltages are supplied, may be disposed in the display panel 110, in addition to the gate lines GL and the data lines DL.

In addition, each of the subpixels SP may accommodate a plurality of circuit elements for driving the subpixel.

Figure 2:
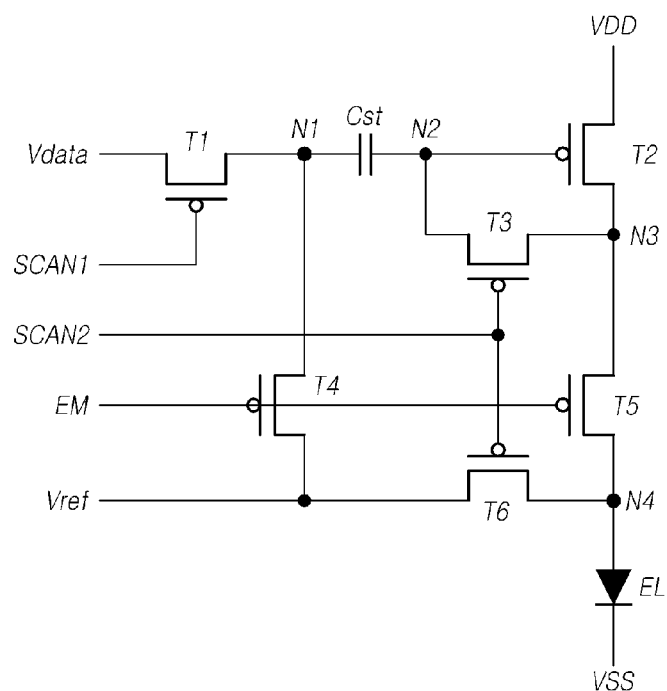
FIG. 2 illustrates a circuit structure and a driving timing diagram of a subpixel arrayed in a display panel according to exemplary embodiments.
Figure 2:
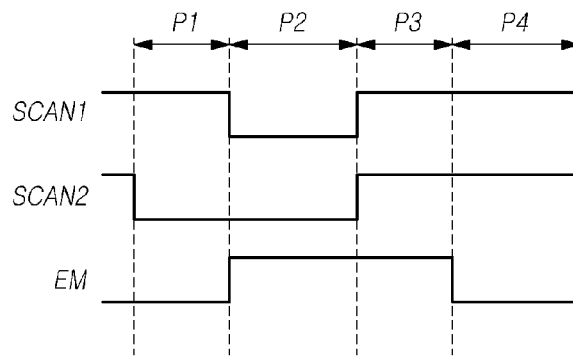

FIG. 2 illustrates a circuit structure of a subpixel SP disposed in the display panel 110 according to an exemplary embodiment.

Referring to FIG. 2, transistors T1, T2, T3, T4, T5, and T6, a capacitor Cst, and a light-emitting element EL may be disposed in the subpixel SP.

FIG. 2 illustrates a 6T1C structure in which six transistors T1, T2, T3, T4, T5 and T6 and one capacitor Cst are disposed. However, the circuit elements constituting the subpixel SP may be disposed differently, depending on (i.e. the type or configuration of) the display device 100.

Furthermore, although the transistors T1, T2, T3, T4, T5, and T6 have been illustrated as being disposed in the subpixel SP are of the p-type transistors, the transistors may be provided as n-type transistors in some cases.

The first transistor T1 is controlled by a first scan signal SCAN1 and controls the application of the data voltage Vdata to a first node N1. The first transistor T1 may be referred to as a "switching transistor".

The second transistor T2 is controlled by the voltage of a second node N2 and controls the supply of the driving voltage VDD. The driving voltage VDD may be a high potential voltage for driving the subpixel SP. The second transistor T2 may be referred to as a "driving transistor".

The third transistor T3 is controlled by a second scan signal SCAN2 and is electrically connected between the second node N2 and a third node N3. The third transistor T3 may be referred to as a "compensating transistor".

The fourth transistor T4 is controlled by an emission signal EM and controls the reference voltage Vref to be applied to the first node N1. The fourth transistor T4 may be referred to as a "first light-emitting transistor".

The fifth transistor T5 is controlled by the emission signal EM and is electrically connected between the third node N3 and a fourth node N4. The fifth transistor T5 may be referred to as a "second light-emitting transistor".

The sixth transistor T6 is controlled by the second scan signal SCAN2 and controls the reference voltage Vref to be applied to the fourth node N4. The sixth transistor T6 may be referred to as an "initializing transistor".

The capacitor Cst may be electrically connected between the first node N1 and the second node N2 and may maintain the data voltage Vdata during a period of time in which the light-emitting device EL emits light.

The light-emitting device EL may be, for example, an organic light-emitting diode (OLED), in which an anode is connected to the fourth node N4, and a base voltage VSS is applied to a cathode. Here, the base voltage VSS may be a low potential voltage for driving the subpixel SP.

Referring to the driving timing illustrated in FIG. 2, when the emission signal EM is at a low level in a first period P1, the second scan signal SCAN2 may be applied at a low level.

Therefore, the third transistor T3 and the sixth transistor T6 can be turned on in a state in which the fourth transistor 14 and the fifth transistor T5 are turned on. The first node N1, the second node N2, the third node N3, and the fourth node N4 may be initialized to the reference voltage Vref.

In the second period P2, the first scan signal SCAN1 having a low level and the emission signal EM having a high level may be applied while the second scan signal SCAN2 is at a low level.

Accordingly, the first transistor T1 may be turned on, and the fourth transistor 14 and the fifth transistor T5 may be turned off.

Further, a data voltage Vdata may be applied to the first node N1 and a voltage obtained by subtracting the threshold voltage of the second transistor T2 from the driving voltage VDD may be applied to the second node N2. In the second period P2, the first transistor is turned on. So, a data voltage Vdata may be applied to the first node N1. And also, in the second period P2, the third transistor T3 and the sixth transistor T6 are turned on, since the second scan signal SCAN2 is at a low level. So, the second node N2 and the third node N3 are electrically connected. So, the second transistor T2 may be driven like a diode. So, the driving voltage VDD may be applied to the second node N2 through the third node N3. And at this time, a voltage (the driving voltage VDD—a threshold voltage Vth of the second transistor T2) could be applied to the second node N2. That is, the application of the data voltage Vdata and the threshold voltage compensation of the second transistor T2 may be performed in the second period P2.

In a third period P3, the first scan signal SCAN1 and the second scan signal SCAN2 having a high level may be applied while the emission signal EM is at a high level. Thus, the first node N1 and the second node N2 may be floated. The first node N1 may be floated since the first transistor T1 is turned off. The second node N2 may be floated since the third transistor T3 is turned off.

In a fourth period P4, in a state in which the first scan signal SCAN1 and the second scan signal SCAN2 are at a high level, the emission signal EM having a low level may be applied.

Thus, the fourth transistor 14 and the fifth transistor T5 are turned on and a current corresponding to the data voltage Vdata is supplied to the light-emitting element EL, so that the light-emitting element EL can emit light having a luminous intensity corresponding to the data voltage Vdata. The first node N1 may be discharged since the fourth transistor 14 is turned on. And a voltage level of the second node N2 may be changed according to a change of a voltage level of the first node N1 (That is, the change of the voltage level of the second node N2 is depending on the data voltage Vdata which is the voltage level of the first node N1). When the voltage level of the second node N2 is changed, the second transistor T2 may be turned on. A current may be flowed through the second transistor T2, and the current may be corresponded to a change of the voltage level of the second node N2. That is, the current may be corresponded to the data voltage Vdata which is applied to the first node N1. And the light-emitting element EL may emit light according to the current which is flowed through the second transistor T2 since the fifth transistor is turned on.

Such a subpixel SP may be divided into an area in which the above-described circuit elements and the like are disposed and an area in which light is emitted by the light-emitting element EL.

Figure 3:
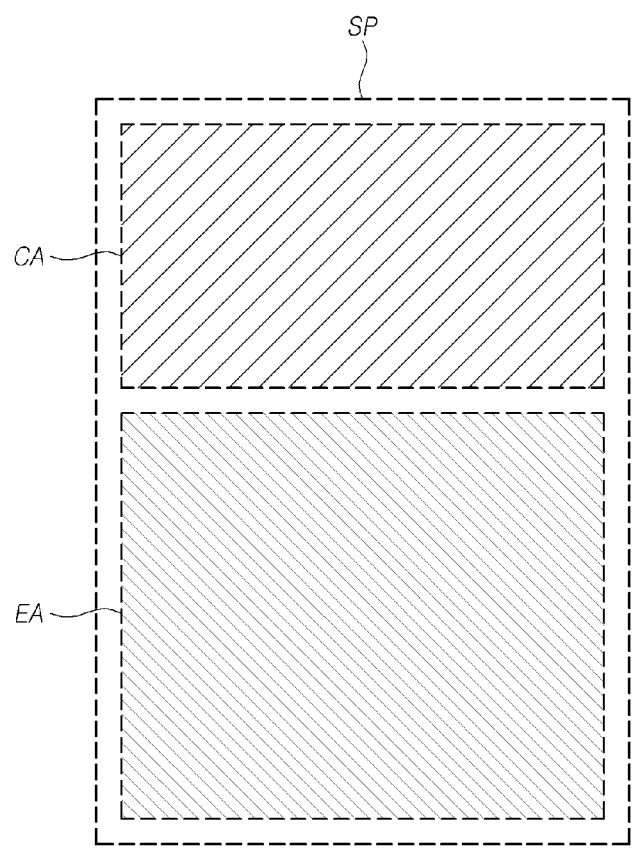
FIGS. 3 and 4 illustrate a schematic structure of subpixels arrayed in the display panel according to exemplary embodiments.
Figure 4:
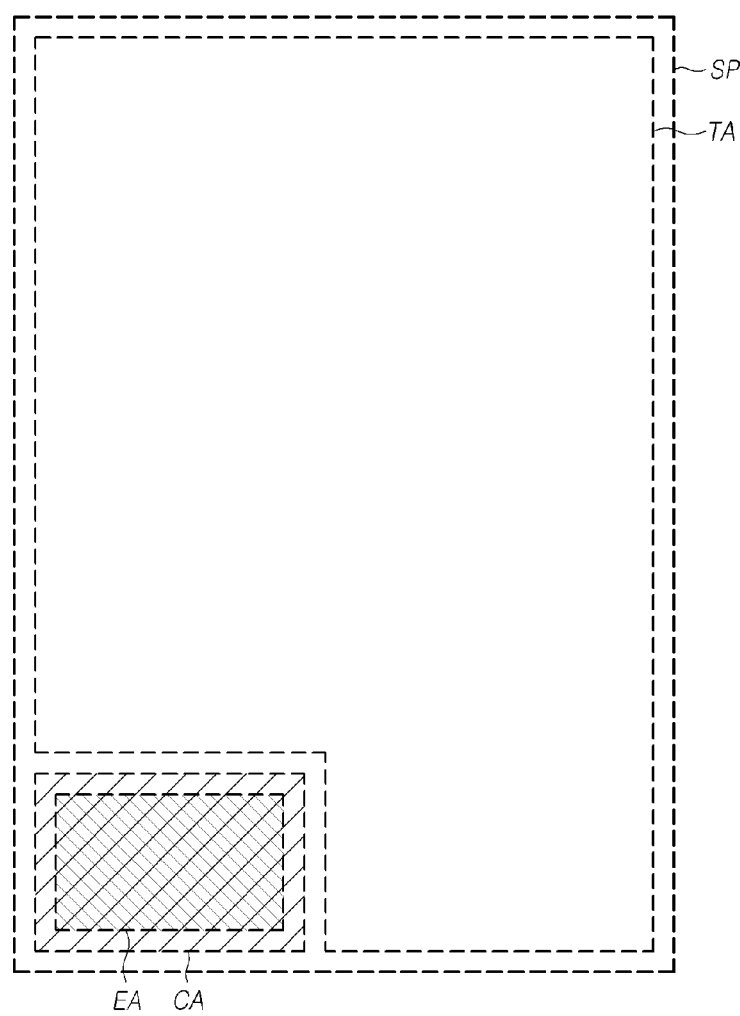

FIGS. 3 and 4 illustrate a schematic structure of the subpixel SP disposed in the display panel 110 according to exemplary embodiments.

Referring to FIG. 3, each of the subpixels SP in the display panel 110 according to exemplary embodiments includes a non-transparent area, that is a circuit area CA in which a plurality of circuit elements for driving the subpixels SP are disposed and a transparent area, that is a light-emitting area EA representing the luminance corresponding to the image data.

The circuit area CA may be an area which is not opened to prevent circuit elements or the like disposed in the circuit area CA from being damaged by external light or the like.

The light-emitting area EA may be an opened area on which the image corresponding to the driving of the subpixel SP is displayed.

The circuit area CA and the light-emitting area EA may be disposed in the subpixel SP so as not to overlap each other.

The higher the ratio of the area occupied by the emission area EA in the subpixel SP is, the better the quality of the image represented by the subpixel SP may be. Therefore, it is necessary to increase the aperture ratio of the subpixel SP.

In addition, in a case in which the display device 100 according to exemplary embodiments is a transparent display device 100, a transparent area TA may be disposed in the subpixel SP in order to increase transparency of the display panel 110.

Referring to FIG. 4, the subpixel SP may include a circuit area CA in which circuit elements are disposed, a light-emitting area EA indicating a luminous intensity corresponding to image data, and a transparent area TA.

The circuit area CA and the light-emitting area EA may be disposed to overlap each other.

The area excluding the circuit area CA and the light-emitting area EA in the subpixel SP may be a transparent area TA.

Thus, the transparent display device 100 may be realized by disposing the transparent area TA in the subpixel SP.

As described above, when the display device 100 is transparent, it is necessary to increase the ratio of the transparent area TA disposed in the subpixel in order to increase the transparency of the display device 100.

That is, it is necessary to minimize the ratio of the circuit area CA in order to increase the aperture ratio or transparency of the display panel 110.

Exemplary embodiments provide a method of increasing the aperture ratio or transparency of the display panel 110 by configuring the thin-film transistors disposed in the circuit area CA of the subpixel SP as a highly integrated high current device.

Figure 5:
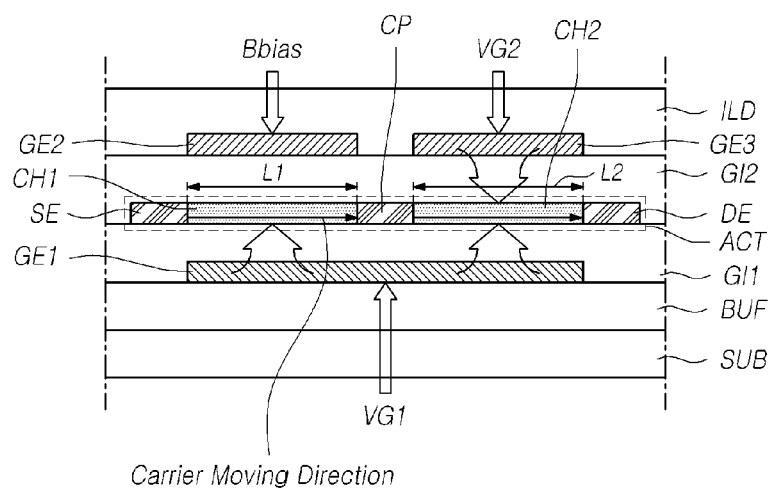
FIG. 5 illustrates a structure of a thin-film transistor disposed on a display panel according to exemplary embodiments.

FIG. 5 illustrates a thin-film transistor disposed in the display panel 110 according to exemplary embodiments.

Referring to FIG. 5, a buffer layer BUF may be disposed on a substrate SUB, and a first gate electrode GE1 may be disposed on the buffer layer BUF.

A first gate insulating layer GI1 may be disposed on the first gate electrode GE1 and an active layer ACT may be disposed on the first gate insulating layer GI1.

This active layer ACT includes a p+ (or n+) doped source region SE and drain region DE, and may include a first channel region CH1 and a second channel region CH2 that are disposed between the source region SE and the drain region DE and separated by a conducting region.

The conducting region disposed between the first channel region CH1 and the second channel region CH2 may be formed in the process of doping the source region SE and the drain region DE. Such a conducting region may be referred to as a "connection pattern (CP)".

The length L1 of the first channel region CH1 and the length L2 of the second channel region CH2 may be the same.

A second gate insulating layer GI2 may be disposed on the active layer ACT, and a second gate electrode GE2 and a third gate electrode GE3 may be disposed on the second gate insulating layer GI2. An interlayer dielectric layer (ILD) may be disposed on the second gate electrode GE2 and the third gate electrode GE3.

The second gate electrode GE2 and the third gate electrode GE3 may be disposed separately from each other.

The second gate electrode GE2 may be disposed to correspond to the first channel region CH1, and the third gate electrode GE3 may be disposed to correspond to the second channel region CH2.

Although the structure has been illustrated such that the gate electrode disposed on the upper portion of the active layer ACT is divided into two gate electrodes GE2 and GE3, the structure may be provided such that the gate electrode disposed at the bottom of the active layer ACT is divided into two gate electrodes.

That is, two gate electrodes may be disposed on the undersurface of the active layer ACT so as to correspond to the first channel region CH1 and the second channel region CH2 respectively, and one gate electrode may be disposed on the active layer ACT so as to correspond to the first channel region CH1 and the second channel region CH2.

The thin-film transistor may be, for example, a driving transistor for driving the light-emitting device EL disposed in the subpixel SP of the display panel 110. That is, the source region SE or the drain region DE of the thin-film transistor according to exemplary embodiments may be electrically connected to the anode of the light-emitting element EL disposed in the subpixel SP. In some cases, the thin-film transistor according to exemplary embodiments may be a thin-film transistor other than the driving transistor disposed in the subpixel SP, or may be a thin-film transistor included in the driving circuit.

Referring to the driving method of the thin-film transistor in the structure illustrated in FIG. 5, a first gate voltage VG1 may be applied to the first gate electrode GE1 disposed under the active layer ACT.

Since the first gate electrode GE1 is disposed to correspond to the first channel region CH1 and the second channel region CH2, when the first gate voltage VG1 is applied to the first gate electrode GE1, a channel is formed in the first channel region CH1 and the second channel region CH2 so that the carrier can move from the source region SE to the drain region DE.

Although the structure has been illustrated such that the first gate electrode GE1 is also disposed under the connection pattern CP, the first gate electrode GE1 may have a U-shaped planar structure such that the first gate electrode is disposed to correspond only to the first channel region CH1 and the second channel region CH2, as required. That is, in some cases, the first gate electrode GE1 may be disposed so as not to overlap at least a portion of the connection pattern CP.

A second gate voltage VG2 is then applied to the third gate electrode GE3 disposed on the active layer ACT to correspond to the second channel region CH2 and adjacent to the drain region DE.

As the second gate voltage VG2 is applied to the third gate electrode GE3 disposed to correspond to the second channel region CH2, an amount of carriers moving from the source region SE to the drain region DE may be increased, so that the current characteristics of the thin-film transistor can be improved.

The second gate voltage VG2 may be the same as the first gate voltage VG1. Alternatively, the second gate voltage VG2 may be a voltage different from the first gate voltage VG1.

That is, the first gate voltage VG1 and the second gate voltage VG2 may be the same or may be different from each other, depending on the thickness of the first gate insulating layer GI1 disposed between the first gate electrode GE1 and the active layer ACT and the thickness of the second gate insulating layer GI2 disposed between the active layer ACT and the third gate electrode GE3.

Alternatively, the first gate voltage VG1 and the second gate voltage VG2 may be differently applied to control the current characteristics of the thin-film transistor.

As described above, as the gate voltage VG is applied to the first gate electrode GE1 disposed under the active layer ACT and the third gate electrode GE3 disposed over the active layer ACT, the electric field formed in the second channel region CH2 can be increased to increase the amount of carriers moving from the source region SE to the drain region DE.

Therefore, the current characteristics of the thin-film transistor can be improved while the size of the thin-film transistor is reduced.

Then, a back bias voltage Bbias may be applied to the second gate electrode GE2 that is disposed on the active layer ACT adjacent to the source region SE so as to correspond to the first channel region CH1.

The back bias voltage Bbias may be a constant voltage that is different from the first gate voltage VG1 and the second gate voltage VG2. For example, when the thin-film transistor is an n-type transistor, the first gate voltage VG1 and the second gate voltage VG2 may be 5V and the back bias voltage Bbias may be 0V. Alternatively, when the thin-film transistor is a p-type transistor, the first gate voltage VG1 and the second gate voltage VG2 may be −5V and the back bias voltage Bbias may be 0V. That is, the back bias voltage Bbias may be a constant voltage that is lower than the absolute values of the first gate voltage VG1 and the second gate voltage VG2. However, this case is only an example, and the gate voltage VG and the back bias voltage Bbias applied to the thin-film transistor according to exemplary embodiments are not limited to the above-described examples. The back bias voltage may be a voltage larger or smaller than 0V. That is, the back bias voltage may a constant voltage which is different from the gate voltage. But it would be preferable that the absolute value of the back bias voltage is smaller than the absolute value of the gate voltage, because the back bias voltage is not a voltage to drive the thin-film transistor.

As the back bias voltage Bbias is applied to the second gate electrode GE2 disposed to correspond to the first channel region CH1, the electric field of the drain region DE is dispersed, so that the current output by the thin-film transistor can be stably outputted.

That is, the current output by the thin-film transistor may be increased by the first gate electrode GE1 and the third gate electrode GE3 disposed to correspond to the second channel region CH2, and the electric field may be stabilized by the second gate electrode GE2 disposed to correspond to the first channel region CH1.

Therefore, it is possible to output a high current while reducing the size of the thin-film transistor to reduce the Kink effect, thereby improving the output characteristics of the thin-film transistor.

The characteristics of the thin-film transistor may be controlled by regulating the thickness of the first gate insulating layer GI1 disposed on the first gate electrode GE1 and the thickness of the second gate insulating layer GI2 disposed on the lower portion of the second gate electrode GE2.

For example, the slope of the S-factor of the thin-film transistor can be increased by allowing the thickness of the first gate insulating layer GI1 to be smaller than the thickness of the second gate insulating layer GI2. Alternatively, the slope of the S-factor can be reduced by allowing the thickness of the second gate insulating layer GI2 disposed under the second gate electrode GE2, to which the back bias voltage Bbias is applied, to be smaller than the thickness of the first gate insulating layer GI1.

As described above, since the thin-film transistor includes the second gate electrode GE2 to which the back bias voltage Bbias is applied, thin-film transistors having various characteristics can be implemented by performing the thickness adjustment of the first gate insulating layer GI1 and the second gate insulating layer GI2.

As illustrated in FIG. 5, boundaries of both sides of the first gate electrode GE1 may be disposed in alignment with the outer boundary of the first channel region CH1 and the outer boundary of the second channel region CH2. However, in some cases, the boundaries may be disposed inside the outer boundaries of the first channel region CH1 and the second channel region CH2 for the adjustment of the electric field.

Figure 6:
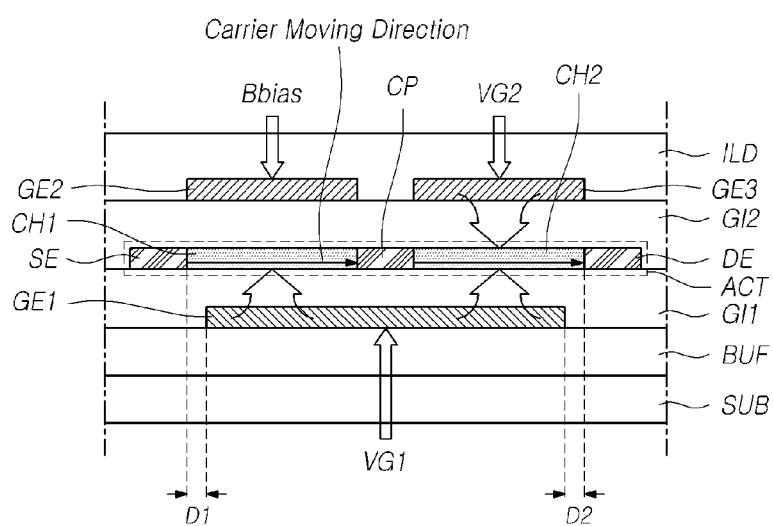
FIG. 6 illustrates another structure of a thin-film transistor disposed in the display panel according to exemplary embodiments.

FIG. 6 illustrates another structure of a thin-film transistor disposed in the display panel 110 according to exemplary embodiments.

Referring to FIG. 6, a buffer layer BUF is disposed on a substrate SUB, and a first gate electrode GE1 is disposed on the buffer layer BUF. A first gate insulating layer GI1 is disposed on the first gate electrode GE1.

An active layer ACT having a source region SE, a first channel region CH1, a connection pattern CP, a second channel region CH2, and a drain region DE is disposed on the first gate insulating layer GI1.

A second gate insulating layer GI2 is disposed on the active layer ACT.

On the second gate insulating layer GI2, a second gate electrode GE2 may be disposed in a region corresponding to the first channel region CH1, and a third gate electrode GE3 may be disposed in a region corresponding to the second channel region CH2.

Here, the first gate electrode GE1 disposed under the active layer ACT may be disposed so as to correspond to at least a portion of the first channel region CH1 and at least a portion of the second channel region CH2.

At least one of both boundaries of the first gate electrode GE1 may be located inwardly from the outer boundaries of the first channel region CH1 and the second channel region CH2. That is, at least one of the first channel region CH1 and the second channel region CH2 extend beyond the first gate electrode GE1 so as to have a portion that does not overlap with the first gate electrode GE1.

For example, one of the boundaries of the first gate electrode GE1, adjacent to the source region SE, may be located inwardly from the outer boundary of the first channel region CH1 by a distance D1.

Alternatively, the other boundary of the first gate electrode GE1, adjacent to the drain region DE, may be located inwardly from the outer boundary of the second channel region CH2 by a distance D2.

Furthermore, as illustrated in FIG. 6, both boundaries of the first gate electrode GE1 may be located inwardly from the outer boundaries of the first channel region CH1 and the second channel region CH2, respectively.

The second gate electrode GE2 and the third gate electrode GE3 disposed on the active layer ACT may be disposed in alignment with the boundaries of the first channel region CH1 and the second channel region CH2, respectively.

That is, the both boundaries of the first gate electrode GE1 may be located inwardly from the outer boundaries of the second gate electrode GE2 and the third gate electrode GE3, so that the electric field of the drain region DE can be adjusted.

Depending on the doping structure of the drain region DE in the active layer ACT, the boundary of the first gate electrode GE1 may be located outwardly from the outer boundary of the third gate electrode GE3.

Figure 7:
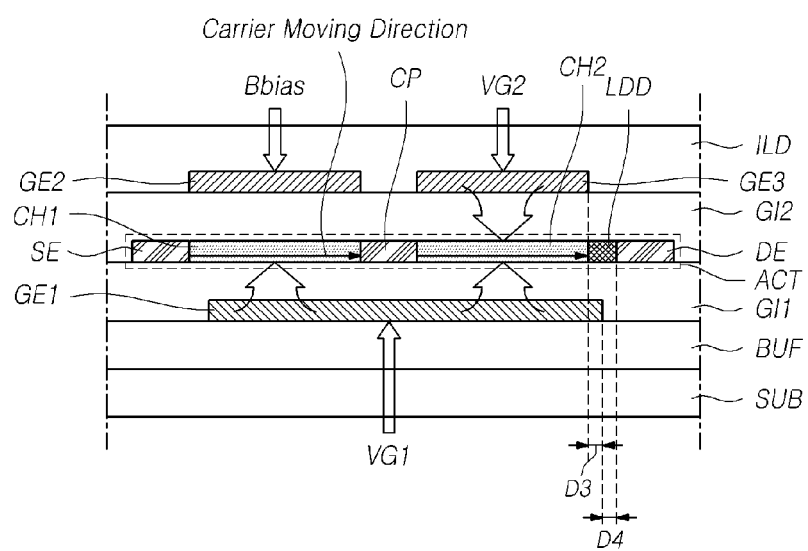
FIG. 7 illustrates another structure of a thin-film transistor disposed in the display panel according to exemplary embodiments.

FIG. 7 illustrates another structure of a thin-film transistor disposed in the display panel 110 according to exemplary embodiments.

Referring to FIG. 7, a first gate electrode GE1 is disposed under an active layer ACT so as to correspond to a first channel region CH1 and a second channel region CH2.

On the active layer ACT, a second gate electrode GE2 is disposed to correspond to the first channel region CH1 and a third gate electrode GE3 is disposed to correspond to the second channel region CH2.

A lightly-doped drain region LDD may be disposed in the active layer ACT adjacent to the drain region DE to reduce a leakage current.

Since the lightly-doped drain region LDD is disposed in the region adjacent to the drain region DE, the first gate electrode GE1 may be overlapped with at least a portion of the lightly-doped drain region LDD.

Therefore, one of both boundaries of the first gate electrode GE1, adjacent to the drain region DE, may be located outwardly from the outer boundary of the third gate electrode GE3 by a distance D3. That is, the horizontal distance (D4) between the first gate electrode GE1 and the drain region DE is smaller than the horizontal distance (D3+D4) between the third electrode GE3 and the drain region DE.

The boundary of the first gate electrode GE 1 may be located inwardly from the drain region DE by a distance D4. In other words, the first gate electrode GE1 may be located outwardly from the third gate electrode GE3 while being located within the drain region DE.

Figure 8A:
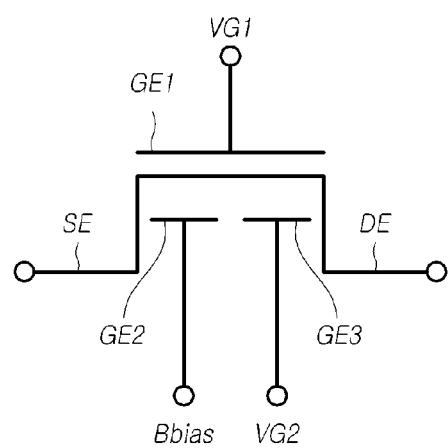
FIGS. 8A, 8B, and 8C illustrate examples of equivalent circuits of thin-film transistors according to exemplary embodiments.
Figure 8B:
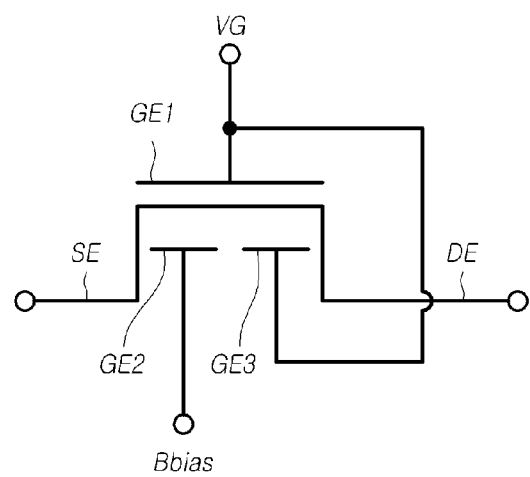
Figure 8C:
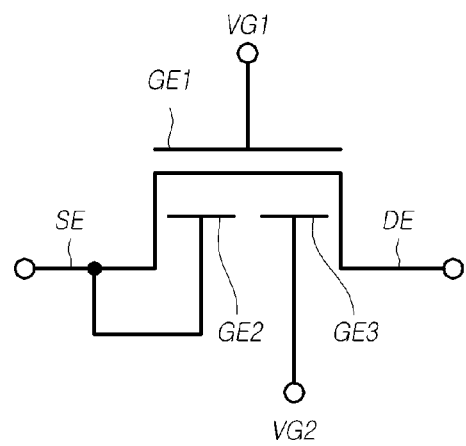

FIGS. 8A to 8C illustrate examples of equivalent circuits of a thin-film transistor according to exemplary embodiments.

Referring to FIG. 8A, a thin-film transistor according to exemplary embodiments may include a first gate electrode GE1 to which a first gate voltage VG1 is applied, and a second gate electrode GE2 to which a back bias voltage Bbias is applied, and a third gate electrode GE3 to which a second gate voltage VG2 is applied.

The first gate voltage VG1 and the second gate voltage VG2 may be the same voltage or may be different voltages, depending on the thickness of the gate insulating layer GI, the current characteristics of the thin-film transistor, and the like.

The back bias voltage Bbias may be a voltage that is different from the first gate voltage VG1 and the second gate voltage VG2 and may be a constant voltage. For example, as described above, the back bias voltage Bbias may be a constant value (e.g. 0V) that is smaller than the absolute values of the first gate voltage VG1 and the second gate voltage VG2.

Since the gate voltage VG is applied to the first gate electrode GE1 and the third gate electrode GE3 of the thin-film transistor, the electric field applied to the second channel region CH2 can be increased, thereby improving the current characteristics of the thin-film transistor.

In addition, since the back bias voltage Bbias is applied to the second gate electrode GE2 disposed to correspond to the first channel region CH1 of the active layer ACT, the electric field of the drain region DE is dispersed, so that the output characteristics of the thin-film transistor can be stabilized.

When the first gate voltage VG1 applied to the first gate electrode GE1 and the second gate voltage VG2 applied to the third gate electrode GE3 are equal to each other, the first gate electrode GE1 and the third gate electrode GE3 may be electrically connected.

Referring to FIG. 8B, the thin-film transistor according to exemplary embodiments may include a first gate electrode GE1, a second gate electrode GE2, and a third gate electrode GE3.

The first gate electrode GE1 and the third gate electrode GE3 may be electrically connected to each other and the gate voltage VG may be applied to the first gate electrode GE1 and the third gate electrode GE3.

As the gate voltage VG is applied to the first gate electrode GE1 and the third gate electrode GE3 disposed on both sides of the active layer ACT, the electric field is increased to improve the current characteristics of the thin-film transistor.

In addition, it is possible to stabilize the output characteristics of the thin-film transistor while providing high current characteristics of the thin-film transistor by allowing the back bias voltage Bbias to be applied to the second gate electrode GE2.

Here, the second gate electrode GE2 to which the back bias voltage Bbias is applied may be electrically connected to the source region SE in some cases.

Referring to FIG. 8C, the current characteristics of the thin-film transistor can be improved by allowing a first gate voltage VG1 to be applied to the first gate electrode GE1 and a second gate voltage VG2 to be applied to the third gate electrode GE3.

The second gate electrode GE2 may be electrically connected to the source region SE. That is, the second gate electrode GE2 may be electrically connected to the source region SE without providing a separate line, through which the back bias voltage Bbias is applied to the second gate electrode GE2, and the electric field of the drain region DE may be dispersed, so that the output characteristics of the thin-film transistor can be stabilized.

Figure 9:
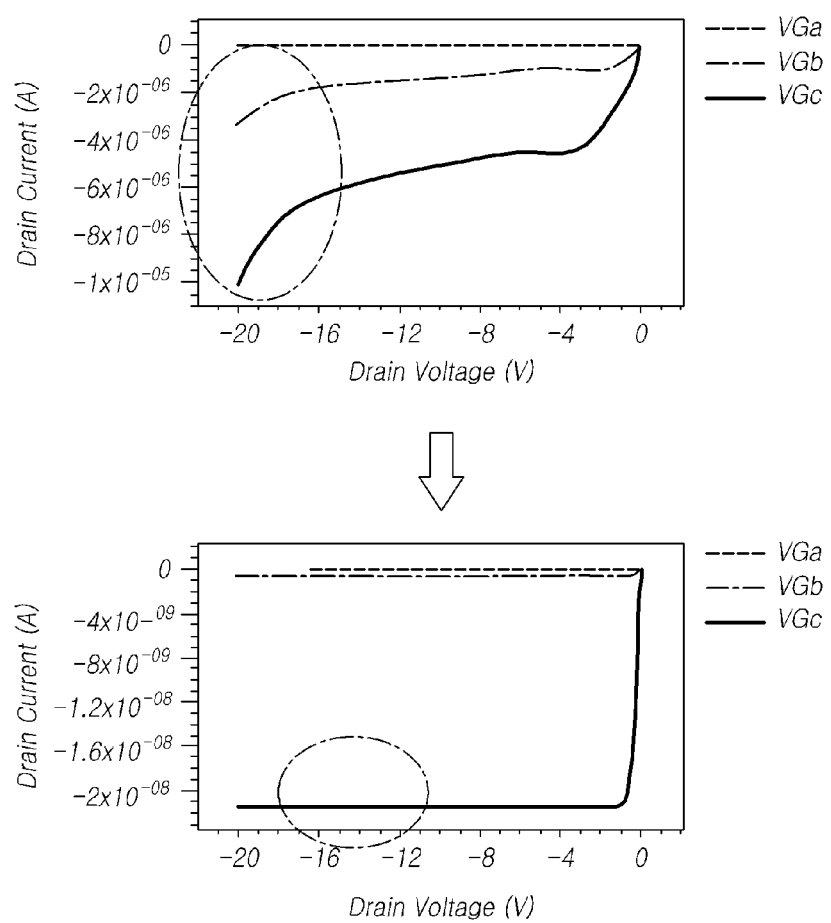
FIG. 9 illustrates an effect of improving the output characteristics of the thin-film transistor according to exemplary embodiments.

FIG. 9 illustrates an effect of improving the output characteristics of a thin-film transistor according to exemplary embodiments.

Referring to FIG. 9, in a case in which a thin-film transistor is provided with a dual gate electrode structure to improve current characteristics of a thin-film transistor, a kink effect may occur in which as the gate voltage VGa, VGb, and VGc are increased, the output characteristics of the drain region DE are rapidly increased.

In contrast, in a case in which the top gate electrode disposed on the top (or bottom) of the active layer ACT is disposed while being divided into the second and third gate electrodes GE2 and GE3, and the back bias voltage Bbias is applied to the second gate electrode GE2, as in exemplary embodiments, it can be seen that the output characteristics of the drain region DE are constant even when the gate voltages VGa, VGb and VGc increase.

According to exemplary embodiments as set forth above, due to a gate electrode, to which a back bias voltage Bbias is applied, being provided in a thin-film transistor having a multi-gate electrode structure, the current characteristic of the thin-film transistor can be improved.

Accordingly, it is possible to provide a thin-film transistor having improved current characteristics and reliability while reducing the size of the thin-film transistor.

In addition, the aperture ratio or transmittance of the subpixel SP can be increased by driving the subpixel SP using the above-described highly integrated high-current device, so that a high-resolution display panel 110 or a transparent display panel 110 can be realized.

The foregoing descriptions and the accompanying drawings have been presented in order to explain certain principles of the present disclosure by way of example. A person having ordinary skill in the art to which the present disclosure relates could make various modifications and variations without departing from the principle of the present disclosure. The foregoing embodiments disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

What is claimed is:

1. A thin-film transistor comprising:
an active layer comprising a source region, a drain region, and a first channel region and a second channel region disposed between the source region and the drain region and separated from each other by a conducting region;
a first gate electrode disposed on a first side of the active layer and overlapped with at least a portion of the first channel region and at least a portion of the second channel region;
a second gate electrode disposed on a second side of the active layer, opposite to the first side, so as to correspond to the first channel region; and
a third gate electrode disposed on the second side of the active layer so as to correspond to the second channel region,
wherein the second gate electrode and the third gate electrode are insulated from each other, a voltage applied to the second gate electrode is different from a voltage applied to the third gate electrode and a voltage applied to one of the second gate electrode and the third gate electrode is same as a voltage applied to the first gate electrode, and
wherein one of both boundaries of the first gate electrode is located inwardly from an outer boundary of the first channel region, and the one of both boundaries of the first gate electrode is located closer to the outer boundary of the first channel region than the conducting region.

2. The thin-film transistor according to claim 1, wherein a gate voltage is applied to the first gate electrode, a back bias voltage is applied to the second gate electrode, and a second gate voltage is applied to the third gate electrode.

3. The thin-film transistor according to claim 2, wherein the first gate voltage and the second gate voltage are the same.

4. The thin-film transistor according to claim 2, wherein the back bias voltage is a constant voltage different from the first gate voltage and the second gate voltage or the back bias voltage is a constant voltage lower than an absolute value of the first gate voltage and an absolute value of the second gate voltage.

5. The thin-film transistor according to claim 1, wherein the second gate electrode and the source region are electrically connected to each other.

6. The thin-film transistor according to claim 1, wherein the first gate electrode and the third gate electrode are electrically connected to each other.

7. The thin-film transistor according to claim 1, wherein at least one of the first channel region and the second channel region extend beyond the first gate electrode so as to have a portion that does not overlap with the first gate electrode.

8. The thin-film transistor according to claim 1, wherein at least one of both boundaries of the first gate electrode is located outwardly from an outer boundary of the second gate electrode and an outer boundary of the third gate electrode.

9. The thin-film transistor according to claim 8, wherein a region corresponding to a region between the at least one of both boundaries of the first gate electrode and the outer boundary of the third gate electrode in the active layer is a lightly-doped drain region.

10. The thin-film transistor according to claim 1, wherein a length of the first channel region is equal to a length of the second channel region.

11. A display panel comprising:
a first gate electrode;
a first gate insulating layer disposed on the first gate electrode;
an active layer comprising a source region, a drain region, and a first channel region and a second channel region disposed between the source region and the drain region and separated from each other by a conducting region;
a second gate insulating layer disposed on the active layer;
a second gate electrode disposed on the second gate insulating layer so as to correspond to the first channel region; and
a third gate electrode disposed on the second gate insulating layer so as to correspond to the second channel region,
wherein the first gate electrode is overlapped with at least a portion of the first channel region and at least a portion of the second channel region,
wherein the second gate electrode and the third gate electrode are insulated from each other, a voltage applied to the second gate electrode is different from a voltage applied to the third gate electrode, and a voltage applied to one of the second gate electrode and the third gate electrode is same as a voltage applied to the first gate electrode, and
wherein one of both boundaries of the first gate electrode is located inwardly from an outer boundary of the first channel region, and the one of both boundaries of the first gate electrode is located closer to the outer boundary of the first channel region than the conducting region.

12. The display panel according to claim 11, wherein a gate voltage is applied to the first gate electrode, a back bias voltage is applied to the second gate electrode, and a second gate voltage is applied to the third gate electrode.

13. The display panel according to claim 12, wherein the source region or the drain region is electrically connected to an anode of a light-emitting element.

14. The display panel according to claim 11, further comprising:
- a plurality of subpixels;
- a plurality of light-emitting elements disposed in each of the plurality of subpixels; and
- a plurality of driving transistors disposed in each of the plurality of subpixels to drive the plurality of light-emitting elements,
- wherein each of the plurality of driving transistors comprises:
- the first gate electrode, the first gate insulating layer, the active layer, the second gate insulating layer and the second gate electrode.

* * * * *